United States Patent
Sato et al.

[11] Patent Number: 6,034,501
[45] Date of Patent: Mar. 7, 2000

[54] DEVICE FOR DRIVING STEPPER MOTOR TYPE MEASURING INSTRUMENT

[75] Inventors: Kouichi Sato; Youichi Simazu, both of Niigata, Japan

[73] Assignee: Nippon Seiki Co., Ltd., Niigata, Japan

[21] Appl. No.: 08/973,422

[22] PCT Filed: Apr. 10, 1997

[86] PCT No.: PCT/JP97/01279

§ 371 Date: Dec. 8, 1997

§ 102(e) Date: Dec. 8, 1997

[87] PCT Pub. No.: WO97/38285

PCT Pub. Date: Oct. 16, 1997

[30] Foreign Application Priority Data

Apr. 11, 1996 [JP] Japan .................................. 8-089455

[51] Int. Cl.[7] .............................. H02P 8/00; H02K 37/00; G01P 3/489; G01D 7/16
[52] U.S. Cl. ........................ 318/696; 318/685; 318/490; 604/30; 73/1.27; 73/1.48; 324/76.52
[58] Field of Search .................... 318/560–696; 604/30; 73/1.27, 1.48; 324/76.52

[56] References Cited

U.S. PATENT DOCUMENTS

| | | | |
|---|---|---|---|
| 3,571,685 | 3/1971 | Akins et al. | 318/603 |
| 3,739,270 | 6/1973 | Miller et al. | 324/166 |
| 3,965,669 | 6/1976 | Larson et al. | 58/146 |
| 4,001,683 | 1/1977 | McNeilly | 324/115 |
| 4,201,077 | 5/1980 | Froidevaux | 73/6 |
| 4,302,712 | 11/1981 | Pritchard | 318/490 |
| 4,346,705 | 8/1982 | Pekkarinen et al. | 128/214 F |
| 4,584,512 | 4/1986 | Pritchard | 318/696 |
| 4,929,879 | 5/1990 | Wright et al. | |

FOREIGN PATENT DOCUMENTS

| | | |
|---|---|---|
| 05 344795 A | 6/1992 | Japan . |
| 5-344795 | 12/1993 | Japan . |
| 6-180323 | 6/1994 | Japan . |

*Primary Examiner*—Paul Ip
*Attorney, Agent, or Firm*—McDermott, Will & Emery

[57] ABSTRACT

A measure obtained by a counting circuit (2) is converted by a processing circuit (3) to an indication angle signal at a predetermined conversion cycle. A smoothing circuit (4) comprises a division circuit (11) for calculating the difference between the previous indication angle data $\theta_0$ and the present indication angle data $\theta_1$ which is outputted after the conversion cycle T and has changed, and sequentially accumulating the angle data corresponding to T/n (where n is an integer of 2 or more) shorter than the conversion cycle T at a division cycle T/n and a voltage memory (12) for converting and outputting a two-phase driving signal for driving a stepper motor type measuring instrument (6) on the basis of the indication angle data $\theta_i$ outputted from the division circuit (11) every division cycle T/n. A voltage signal is generated through an output circuit (5) for converting the signal to a voltage signal to be applied to a two-phase excitation coil of a stepper motor. This voltage signal drives the stepper type motor measuring instrument (6) and rotates a pointer (9) fixed to the end of a driving shaft at angle indication corresponding to a scale (8) of a dial (7).

6 Claims, 3 Drawing Sheets

DEVICE FOR DRIVING STEPPER MOTOR TYPE MEASURING INSTRUMENT

This application is a 371 of PCT/JP97/01279 filed Apr. 10, 1997.

TECHNICAL FIELD

The present invention relates to a drive apparatus for a stepping motor type meter used as a measurement movement for facilitating digital control in place of an ammeter comprising a movable coil type or cross coil type rotating magnet or the like and more particularly, for a stepping motor type meter which indicates measurements based upon signal input of a frequency proportional to a measurement amount such as the travelling speed or engine revolutions of an automobile.

BACKGROUND ART

Generally, this type of meter rotates a pointer fixed to one end of a drive shaft of the movement of the meter corresponding to an input signal and indicates a measurement by way of contrast and legibility against a dial provided with numbers or a scale for showing a measurement amount, and is normally constructed so as to indicate a linear indication characteristic by a scale of substantially equal increments.

In particular, in the case of the stepping motor the stepping operation of the magnet rotor is determined by the number of tooth of the toothed yoke and the pitch formed thereby so that in order to attain a smooth rotating operation, it is necessary to increase the number of teeth and reduce the pitch of the teeth, or alternatively, perform a so-called micro-step drive by means of a drive signal and the type of stepping motor is selected based on the allowable size of the stepping motor main unit meeting the condition of use and the cost of including a drive circuit.

Further, such a stepping motor as this is desired to be compact regardless of its applications. Since a so-called PM type stepping motor has a simple structure, it is made easy to use due to its improved rotor magnet and toothed yoke.

Further, in contrast to the digitization of the processing circuit (controlled by a microcomputer), this type of stepping motor in which pulse signal control is performed has attracted attention also as a movement for an indicating meter, which indicates a comparative readout on a dial scale by means of a pointer—for example, it can be used in a speedometer or engine tachometer of an automobile, or as a heat gauge or thermometer by way of A/D processing of a detection signal, with various proposals for practical applications forthcoming, such as those disclosed in Unexamined Japanese Patent Application S61-129575, Unexamined Japanese Patent Application H1-223312, etc.

In addition, it is common for a plurality of indicating meters such as a speedometer or tachometer to be used simultaneously in this type of measuring apparatus, and in cases where a processing circuit is provided for each of these meters it is necessary to use the least expensive circuit components in view of the production cost, to which extent indication control having a slow computing speed becomes inevitable.

Also, with the digitization of signal processing, time division processing by means of a digital processing circuit such as a microcomputer from a control system in which each indicating meter is processed is developing, wherein the computation processing cycle is allocated by the responsiveness of each meter corresponding to the subject being measured (speedometers and tachometers have fast cycles, heat gauges and thermometers have slow cycles), necessitating processing circuits with high computation processing speeds according to an increase in the number of driving indicating meters.

However, where expensive processing circuits are not used in view of the production cost, or where many indicating meters are time-divisionally driven, there is a limitation to the compression of a computation processing cycle allocated to one indicating meter. For example, given that a drive update cycle necessary to smoothly rotate the pointer corresponding to a measurement amount which varies to a great degree, such as engine revolutions, is 10 milliseconds, and the allocation limit of the computation processing cycle of the processing circuit is only 20 milliseconds, the pointer can only move intermittently with respect to changes in the measurement amount and a smooth indication characteristic cannot be attained.

In particular, although a stepping motor attains smoothness by correcting the wave form of the drive signal on the basis of a step operation corresponding to the pitch of the teeth on the toothed yoke, where a measurement data updating cycle is large with respect to changes in a measurement amount, changes in the drive signal to the stepping motor itself are also large. Also, although when changes in the measurement amount are fast the intermittent movement of the pointer is relatively inconspicuous due to its fast movement, where the responsiveness of the stepping motor itself is excellent or, conversely, where changes in the measurement amount are gradual, it was confirmed that large changes in this data directly caused intermittent movement of the pointer and there was the problem that a smooth indicating characteristic as an indicating meter could not be achieved.

The present invention has for its object to enable smooth drive to an extent which is imperceptible even where the conversion processing capability, i.e. conversion processing cycle, of a processing circuit for computation processing measurement data and converting and outputting an indication angle signal is not sufficiently short to attain smooth movement of the stepping motor with respect to changes in the measurement amount.

DISCLOSURE OF INVENTION

The present invention provides a measuring apparatus having a drive circuit for driving a stepping motor based on a digital signal corresponding to a measurement amount and which displays the measurement amount by indicating an increment on a scale on a dial corresponding to the measurement amount by means of a pointer fixed to an end of a drive shaft of the stepping motor, and is characterized by comprising a processing circuit for inputting a digital signal corresponding to the measurement amount and converting it to an indicating angle signal in a predetermined cycle, and a smoothing circuit for obtaining a difference between successive before and after indicating angle signals output in the conversion cycle of the processing circuit and dividing the difference into integral parts corresponding to a divisor thereof in a separating cycle which is shorter than the conversion cycle of the processing circuit, and modifying the indicating angle signal for every divided indicating angle part as the division result in every separation cycle during subsequent conversion cycles.

Also, the present invention is characterized by comprising a processing circuit for inputting a digital signal D corresponding to the measurement amount and converting it to an indicating angle signal θ in a predetermined cycle, and a smoothing circuit for obtaining a difference Δθ with respect to an indicating angle signal θh prior to a newest indicating angle signal θi output in the conversion cycle of the processing circuit, and modifying, by sequential addition, an indicating angle corresponding to Δθ/n in the previous indicating angle signal θh, at every short cycle corresponding to 1/n (n is a plural integer) of the cycle of the processing circuit.

Further, the present invention is characterized by the processing circuit being constructed so that, as well as producing indicating signals for driving a plurality of indicating meters including other indicating meters, it also produces and outputs an indicating signal to each of the indicating meters by means of a time division process, and the conversion cycle is a period equal to or longer than a period in which processing is possible, allocated by the time division process.

Still further, the present invention is characterized in that the above-mentioned plurality of indicating meters are all stepping motor type meters.

In addition, the present invention is characterized in that an updating process of the indicating angles modified at every cycle shorter than the conversion cycle commences from a point in time either substantially synchronous with the conversion cycle or after one cycle of the shorter cycle.

Finally, the present invention is characterized by comprising a processing circuit for inputting a digital signal corresponding to the measurement amount and converting it to an indicating angle signal θ in a predetermined cycle T, and a smoothing circuit for obtaining a difference Δθ with respect to an indicating angle signal θh prior to a newest indicating angle signal θi output in the conversion cycle T of the processing circuit, and modifying, by sequential addition, an indicating angle corresponding to Δθ/n in the previous indicating angle signal θh, at every short cycle T/n corresponding to 1/n (n is a plural integer) of the cycle of the processing circuit, wherein the short cycle T/n is scale 8 milliseconds or less.

BRIEF DESCRIPTION OF THE DRAWINGS

The details of the invention will be described in connection with the accompanying drawings, in which.

BEST MODE FOR CARRYING OUT THE INVENTION

Figure 1:
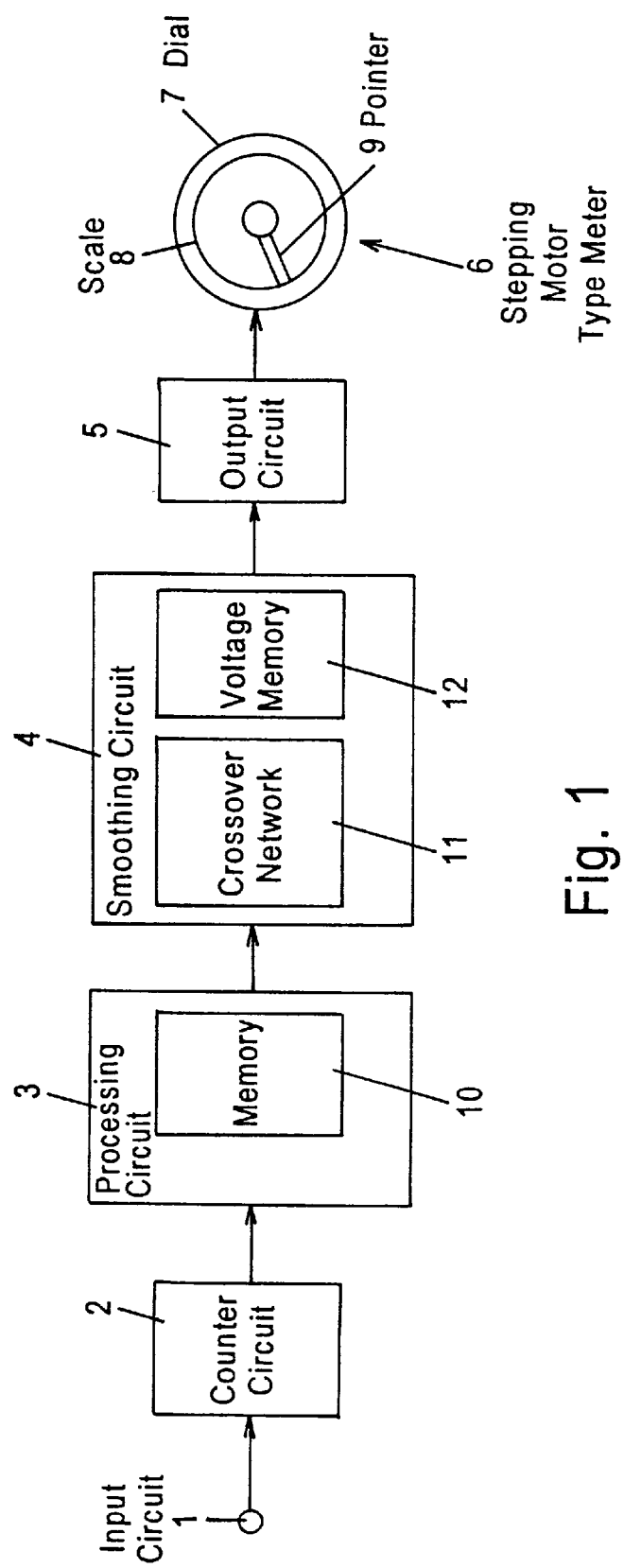
FIG. 1 is a circuit schematic of an embodiment of the present invention, FIG. 2 (counter circuit) is a drive wave form graph illustrating an example of a driving signal wave form for the stepping motor of the present invention.

FIG. 1 shows the basic structure of the present invention and, explaining this with the speedometer of an automobile as an example, once a frequency signal proportional to the travelling speed of the automobile which is the measurement amount is input from an input terminal 1, in a counter circuit 2 the rises and falls in the input signal are detected and counted by predetermined gate times (gate time method) or by counting a different high frequency clock signal by means of the input signal (frequency measurement method) and computing the forward speed which changes moment by moment as digital data D.

The measurement amount obtained by the counter circuit 2 is converted to an indicating angle signal θi at a predetermined conversion cycle T in the processing circuit 3, is changed by a smoothing circuit 4 corresponding to every angle 1/n of a successive before and after angle difference Δθ of the converted indicating angle signal θi at every separation cycle T/n (where n is a plural integer), which is shorter than the conversion cycle T, drives the stepping motor type meter 6 via an output circuit 5 (not necessary when the meter is capable of being driven by the output of the smoothing circuit 4) such as a voltage converter or the like, and rotates a pointer 9 fixed to the end of a shaft driven at angular increments corresponding to those on a scale 8 of a dial 7.

Each of the above circuits properly processes input signals and drives the stepping motor type meter 6 as a driving circuit, and the processing circuit 3 can be constructed by a microcomputer which includes the counter circuit 2 so that the measurement indicating characteristic can be arbitrarily set to indicate the forward speed, comprises a memory (ROM) 10 in which indicating angle data (indicating angle signal) θi corresponding to the counted digital data D has been stored, and takes in the digital data at a predetermined conversion cycle and reads out the indicating angle signal θi of the memory address corresponding thereto.

This processing circuit 3, in cases where an inexpensive IC whose processing speed is slow with respect to a single indicating meter drive such as the speedometer described here is used, or in cases where other indicating meters not shown in the drawings, such as an engine tachometer, a heat gauge, a thermometer, an oil pressure meter, and a voltage meter (these meters may all be stepping motor type meters, or other measuring movements such as a cross coil type meter, movable coil type meter, or the like may be jointly used) are simultaneously time division driven, the processing cycle allocated to the speedometer has insufficient processing capability to attain smooth responsiveness.

Also, storing of the indicating angle data θi in the memory 10 of the processing circuit 3 holds numbers of data for attaining a desired resolution corresponding to a prior indicating region from a minimum (MIN) and maximum (MAX) of the digital data D corresponding to the measurement amount, stores indicating angle data i in 0.5° units with respect to an indicating angle from 0° (MIN) to 360° (MAX) for example, and reads out this stored indicating angle data θi corresponding to the digital data D in a predetermined conversion cycle T.

Figure 2:
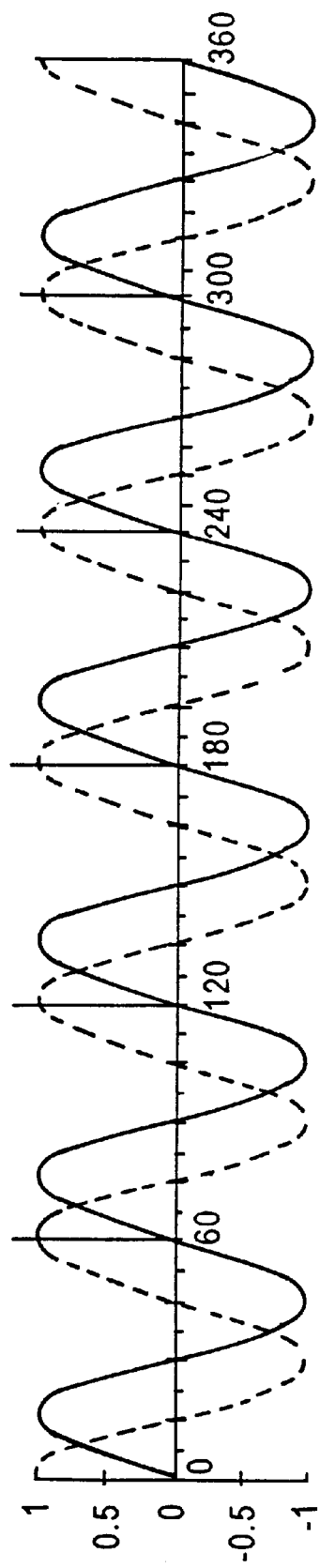

The smoothing circuit 4 obtains a difference of changed indicating angle data θ1, i.e. an angular difference Δθ (θ1−θ0) of successive before and after indicating angle data, output after the conversion cycle T from the previous indicating angle data θ0 with respect to the indicating angle data θi output at the conversion cycle T from the processing circuit 3, comprises a crossover network 11 for sequentially adding angle data corresponding to Δθ/n at every separation cycle T/n (where n is a plural integer) which is shorter than the conversion cycle T and a voltage memory 12 for converting this and outputting a two-phase drive signal for driving the stepping motor type meter 6 based on the indicating angle data θ for every separation cycle T/n output by the crossover network 11, and produces a voltage signal as shown in FIG. 2 for example via the output circuit 5 for converting to a voltage signal to be applied to the two-phase exciting coil of the stepping motor.

Although the signal wave form for driving the stepping motor can be set to an arbitrary two-phase signal by the number of teeth and pitch of the toothed yoke, and data of all driving wave forms corresponding to all indicating angles within 360° can be stored in the voltage memory 12, here 60° portions of voltage data formed by dividing 360 into six are provided in the voltage memory 12 as stepping motor drive signals of the stepping motor type meter 6, and have a structure which reduces the memory capacity in a system which uses this data in every angle region.

In other words, the voltage wave form of the drive signal applied to the two-phase exciting coils A and B with respect to the 360° rotating angle of the pointer 9 (coupled magnet rotor) of the stepping motor type meter 6, as shown in FIG. 2, imparts a change of substantially SIN and COS wave forms within a 60° angle, and expands to all of the 60° angular regions a through f by way of this voltage wave form. This expanding process can be determined by indicating angle data θ corresponding to the indicating region of the digital data D, stores drive voltage data V in the voltage memory 12 at a resolution of 60° divided into 512 (storing data at 60/512° angular differences from θ0 with respect to 0° to 60° with respect to 60°), and with respect to the digital data D of indicating angle regions b to f as well as the reading out of the voltage data V corresponding to the digital data D, as well as determining each indicating region, it can read out the voltage data V within the determined region from the voltage memory 12 and obtain an indicating position on a meter by a combination with the determined region.

With regard to this, where the teeth of the yoke of the stepping motor are arranged in at least one group each in the indicating regions of FIG. 2, because the polar position of the magnet rotor moves only to the excitation position within the region, rather than the drive signals differing for each indicating region, by determining the indicating region based on the digital data D the voltage data V read out from the voltage memory 12 can be read out; for example, if the digital data D corresponds to the indicating angle 150°, the region is determined as c and by reading out data corresponding to 30° within the region from the voltage memory 12 the drive signal is as shown in FIG. 2.

Here, the drive wave form shown in FIG. 2 is a substantially curved wave form in order to attain a smooth operation of the mechanical step operation determined by the tooth pitch of the yoke of the stepping motor by means of so-called micro-steps. In fact, SIN and COS wave forms are digital minute stepped wave forms and the pitch of the micro-steps is set the speed of change of the measurement amount indicated by the meter, i.e. the angular speed of the pointer, and the processing capability of the processing circuit.

The applicants of the present invention, performed fabrication and characteristic tests on an actual indicating meter based on such a basic structure, and as the stepping motor main unit serving as the meter movement using the stepping motor type meter 6, wound an exciting coil for exciting the two-phase drive wave form around two stacked resin bobbins, stacked toothed yokes above and below each bobbin and used a PM die of well-known structure to rotatably support the magnet rotor in the intermediate portion of this bobbin stack.

In each toothed yoke, six teeth are formed positioned opposite each other at each phase so that over the entire circumference 24 teeth are arrayed, and are formed having a mechanical step pitch of 15° and so that four teeth correspond within each angular limit of 60° of the indicating regions a through f shown in FIG. 2.

The processing circuit 3 performs time division driving for simultaneously drive processing other meters or alarm displays by means of a microcomputer, and a conversion cycle T of 16 milliseconds is set allocated to the speedometer and the movement of the pointer 9 was observed when the digital data D was changed to various angular speeds.

The setting of the division cycle T/n of the crossover network 11 in the smoothing circuit 4 at this time was performed stepwise by changing n, the angular speed was changed under the division cycle T/n thus set, and an allowable value at which the rotation of the pointer 9 was seen to rotate with sufficient smoothness even when there was a gradual change in the digital data D, i e. forward speed, was selected.

Although the smoothness of the rotation of the pointer 9 differs according to the observational powers of the person observing it, the applicants of the present invention, as well as determining visual smoothness, actually rotated the pointer 9 at various angular speeds, and selected a division cycle having relatively uniform changes due to the data characteristic wave form with respect to a plurality of angular speed axes of a rotation indication characteristic observed at the rotation speed change rate of the pointer 9 (attained by fixing an optical rotary encoder to the pointer axis and measuring changes in the angular speed of the pointer, for example).

In actuality, as well as further setting the conversion cycle T at 16 milliseconds, the angular speed ω is changed to a low speed region of 10°/sec units and a high speed region of 100°/sec units within a range of 10°/sec to 1080°/sec, and under these conditions the cycle is set from 16 milliseconds to units of 1 millisecond as a shorter cycle, and the rotational smoothness of the pointer 9 confirmed.

As a result, smoothness is-visually favorable within the entire range of angular speeds, and a cycle which is relatively uniform even by way of characteristic data of the rotational speed change rate is 8 milliseconds or less, while a cycle which is very uniform as indicated by the characteristic data and imparts stable smoothness without visual irregularities as viewed by an observer is 4 milliseconds or less.

Accordingly, the division cycle T/n applied to the embodiment of the present invention, where the conversion cycle T has been set at 16 milliseconds, an allowable indicating characteristic can be attained in the 8 milliseconds corresponding to half this cycle as a visual or comparative meter with rotation speed change rate, and it was judged by repeating characteristic verification in this manner that a division cycle in which the rotation smoothness of the pointer 9 is favorable is 8 milliseconds or less, and optimally 4 milliseconds or less. Also, where the conversion cycle T is 20 milliseconds for example, the division cycle T/n is set at 5 milliseconds (n=4) with 10 milliseconds (n=2) which is close to 8 milliseconds as the limit, and where the conversion cycle T is 15 milliseconds, the division cycle T/n is set to 5 milliseconds (n=3), whereupon it was determined that smooth rotational indication of the pointer 9 can be attained.

Figure 3:
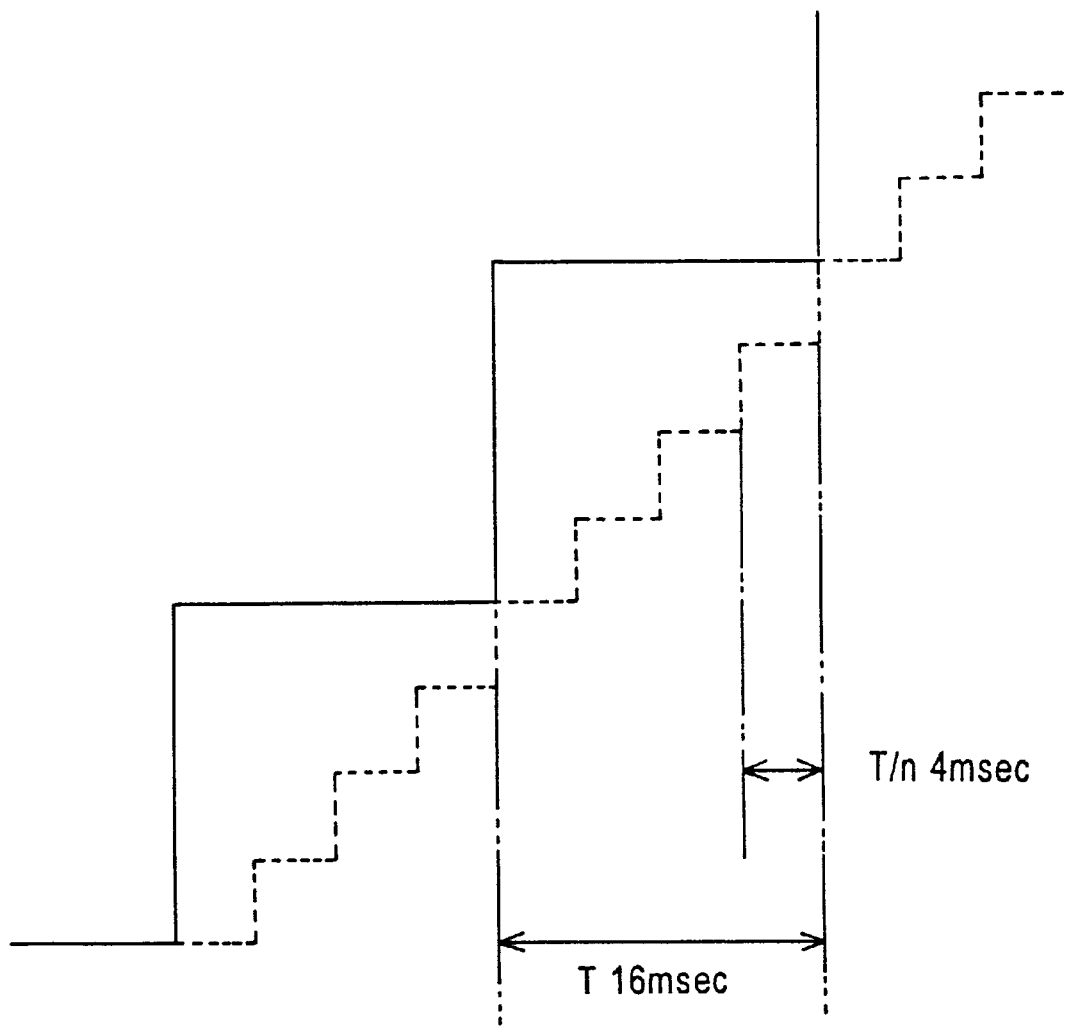
FIG. 3 is a graph of a dividing step wave form illustrating a step cycle of the drive wave form of the present invention.

FIG. 3 (proceeding circuit) shows the change characteristic of the indication angle data θ where n=4 and the division cycle T/n (4 milliseconds) is set with respect to the conversion cycle T (16 milliseconds), and with respect to a change of the 16 millisecond conversion cycle allocatable to the speedometer in the processing circuit 3 which converts, by means of a data table in the memory 10, the digital data D corresponding to the forward speed, data is updated in a four millisecond division cycle, but if a change to the indication angle data in this 16 millisecond conversion cycle, i.e. the difference Δθ of successive before and after indication angle data, is taken as 2°, the data added and updated in every four millisecond division cycle becomes 2°/4=0.5°, and as shown in the drawing, with respect to the 2° difference from indicating angle data θ0 at the point T0 to the indicating angle data θ1 at the point T1 after the conversion cycle, the change at the point T1 is obtained, updated upward stepwise by 0.5° each time from the initial division cycle lapse time, four milliseconds after the conversion cycle T1, and subsequent changes from T2 onwards are performed by the same process.

Note that, other than the timing of FIG. 3 where the 0.5° computation update is at the initial division cycle time which is four milliseconds from the conversion cycle T1, if processing from the conversion cycle T1 can be made momentary it is possible to start from a time substantially simultaneous with the conversion cycle T1.

The 2° change every 16 milliseconds at this time is the rotation angle of the pointer 9, and where the speedometer is such that 240° on the scale 8 of the dial 7 thereof is set to 180 Km/h, the change of the indication angle data 2°/16 milliseconds corresponds to 1.5 Km/h (180/240*2) changing in 16 milliseconds, this corresponds to an acceleration increase of 94 Km/h in one second, and although this is a change that cannot exist in actual forward motion, the division result shown in FIG. 3 is set by the division cycle T/n as a numerical value for ease of understanding.

In actuality, although changes in speed during normal forward motion do not occur as angular speed to an equivalent extent during sudden acceleration or sudden deceleration, with regard to an engine tachometer, changes occur extremely rapidly, therefore there are times when it reaches 2° per 16 milliseconds, i.e. an indication angle of 125° or more on the dial of the meter is one second, and rotational indication in even smaller angular steps can be attained in 4 millisecond cycles at every 0.5° during such changes.

In such a case, although rotation in a 0.5° division cycle is in numerically large step angles, because the angular speed is a quick movement in the 4 millisecond cycle, it has been confirmed that this is visually a smooth movement, and where the angular speed is slow, for example, an acceleration of 10 Km/h in one second in a normal forward acceleration, movement in extremely small steps of approximately 13/sec, i.e. 0.05° in the 4 millisecond cycle at 240°*10/180 can be attained.

With the stored data resolution of the present embodiment, 60/512°, i.e. 0.117° unit data is possible, thus in fact the 0.05° step possible in the 4 millisecond cycle cannot be achieved, and although 0.117° step operation is possible in an enforced 8 millisecond cycle, a step operation in at least the units of basic data resolution can be attained and visually there are no problems whatsoever. Further, if data having more detailed basic resolution, e.g. resolution of 60/1200° or more, is stored, the step operation of 0.05° in 4 milliseconds can be achieved, and an extremely smooth indication characteristic can be achieved by a step operation which largely cannot be visually observed. Consequently, also with regard to the smoothness in this angular speed, a characteristic which is visually allowable was confirmed with approximately 8 milliseconds or less as the data update cycle, and this was determined to be a division cycle which could guarantee favorable smoothness within the range of the angular speed used as the indicating meter.

In a processing circuit-constructed within such a driving apparatus, as well as a microcomputer being used and various types of meter driving controls being performed by a computation program, the smoothing circuit can be constructed by combining gate circuits by means of a semiconductor, and in particular the microcomputer is effectively utilizable when there are many load controls.

As described above, according to the drive apparatus for stepping motor type meter of the present invention, the processing circuit for inputting measurement amount data obtains a difference of changed indicating angle data 1, i.e. an angle difference Δθ (θ1−θ0) of successive before and after indicating angle data, output after the conversion cycle T from the previous indicating angle data θ0 with respect to the indicating angle data θi output at the conversion cycle T and produces a divided voltage signal having a minutely stepped wave form by means of a smoothing circuit for sequentially adding angle data corresponding to Δθ/n at every separation cycle T/n (where n is a plural integer) which is shorter than the conversion cycle T.

Thereby, although a smooth movement could not be attained in the conversion cycle T of the processing circuit, a smooth indication characteristic can be attained in the division cycle T/n, and in particular where the division cycle is 8 milliseconds or less, or optimally 4 milliseconds or less, a stepping motor type meter having a smooth indication characteristic which is not visibly unnatural can be attained.

Consequently, in relation to production costs, where expensive processing circuits are not used, or where there is a limit to compression of the computation processing cycle assigned to one meter when many meters are time division operated, and where, for example, allocation of the computation processing cycle of the processing circuit cannot follow the drive update cycle necessary to smoothly rotate the pointer corresponding to a measurement amount in which changes are severe, such as engine revolutions, and the pointer can only move intermittently with respect to changes in the measurement amount, a smooth indication characteristic can be attained as the indicating meter by movement during the division cycle by means of the smoothing circuit.

Industrial Applicability

As described above, the present invention can be applied to use in an electrical movement of an indicating meter when working towards miniaturization, for inputting a physical measurement amount as an electrical signal and performing corresponding indication on a scale of a dial by means of a pointer.

We claim:

1. A drive apparatus for a stepping motor type meter, which stepping motor type meter is a measuring apparatus having a drive circuit for driving the stepping motor based on a digital signal corresponding to a measurement amount and which displays the measurement amount by indicating an increment on a scale on a dial corresponding to the measurement amount by means of a pointer fixed to an end of a drive shaft of the stepping motor, comprising:

a processing circuit for inputting a digital signal corresponding to the measurement amount and converting it to an indicating angle signal in a predetermined cycle; and a smoothing circuit for obtaining a difference between successive before and after indicating angle signals output in the conversion cycle of the processing circuit and dividing the difference into integral parts corresponding to a divisor thereof in a separating cycle which is shorter than the conversion cycle of the processing circuit, and modifying the indicating angle signal for every divided indicating angle part as the division result in every separation cycle during subsequent conversion cycles.

2. The drive apparatus for a stepping motor type meter according to claim 1, wherein the processing circuit is constructed so that, as well as producing indicating signals for driving a plurality of indicating meters including other indicating meters, it also produces and outputs an indicating signal to each of the indicating meters by means of a time division process, and the conversion cycle is a period equal to or longer than a period in which processing is possible, allocated by the time division process.

3. The drive apparatus for a stepping motor type meter according to claim 3, wherein the plurality of indicating meters are all stepping motor type meters.

4. The drive apparatus for stepping motor type meter according to claim 1, wherein an updating process of the indicating angles modified at every cycle shorter than the conversion cycle commences from a point in time either substantially synchronous with the conversion cycle or after one cycle of the shorter cycle.

5. A drive apparatus for a stepping motor type meter, which stepping motor type meter is a measuring apparatus having a drive circuit for driving the stepping motor based on a digital signal corresponding to a measurement amount and which displays the measurement amount by indicating an increment on a scale on a dial corresponding to the measurement amount by means of a pointer fixed to an end of a drive shaft of the stepping motor, comprising:

a processing circuit for inputting a digital signal D corresponding to the measurement amount and converting it to an indicating angle signal in a predetermined cycle; and a dividing circuit for obtaining a difference $\Delta\theta$ with respect to an indicating angle signal $\theta h$ prior to a newest indicating angle signal $\theta i$ output in the conversion cycle of the processing circuit, and modifying, by sequential addition, an indicating angle-corresponding to $\Delta\theta/n$ in the previous indicating angle signal $\theta h$, at every short cycle corresponding to $1/n$ (n is a plural integer) of the cycle of the processing circuit.

6. A drive apparatus for a stepping motor type meter, which stepping motor type meter is a measuring apparatus having a drive circuit for driving the stepping motor based on a digital signal corresponding to a measurement amount and which displays the measurement amount by indicating an increment on a scale on a dial corresponding to the measurement amount by means of a pointer fixed to an end of a drive shaft of the stepping motor, comprising:

a processing circuit for inputting a digital signal corresponding to the measurement amount and converting it to an indicating angle signal $\theta$ in a predetermined cycle T; and a smoothing circuit for obtaining a difference $\Delta\theta$ with respect to an indicating angle signal $\theta h$ prior to a newest indicating angle signal $\theta i$ output in the conversion cycle T of the processing circuit, and modifying, by sequential addition, an indicating angle corresponding to $\Delta\theta/n$ in the previous indicating angle signal $\theta h$, at every short cycle $T/n$ corresponding to $1/n$ (n is a plural integer) of the cycle of the processing circuit, wherein the short cycle $T/n$ is scale 8 milliseconds or less.

* * * * *